(12) United States Patent
Kuhn et al.

(10) Patent No.: US 11,307,231 B2
(45) Date of Patent: Apr. 19, 2022

(54) MEASUREMENT SYSTEM AND METHOD FOR DETERMINING A PHASE AND AMPLITUDE INFLUENCE OF A DEVICE UNDER TEST

(71) Applicant: Rohde & Schwarz GmbH & Co. KG, Munich (DE)

(72) Inventors: Christian Kuhn, Munich (DE); Werner Held, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 164 days.

(21) Appl. No.: 16/723,213

(22) Filed: Dec. 20, 2019

(65) Prior Publication Data

US 2020/0200810 A1 Jun. 25, 2020

Related U.S. Application Data

(60) Provisional application No. 62/784,128, filed on Dec. 21, 2018.

(51) Int. Cl.
*G01R 23/12* (2006.01)
*G01R 27/28* (2006.01)
(Continued)

(52) U.S. Cl.
CPC ....... *G01R 27/28* (2013.01); *G01R 31/31917* (2013.01); *G06F 1/022* (2013.01); *H03H 17/06* (2013.01); *H03L 7/0814* (2013.01)

(58) Field of Classification Search
CPC ............ G01R 31/2837; G01R 31/2839; G01R 31/2805; G01R 31/2812; G01R 31/2822;
(Continued)

(56) References Cited

U.S. PATENT DOCUMENTS

| 5,656,932 A | 8/1997 | Kitayoshi |
| 10,006,952 B1 * | 6/2018 | Bradley ................. G01R 27/28 |

(Continued)

*Primary Examiner* — Thang X Le
(74) *Attorney, Agent, or Firm* — Christensen O'Connor Johnson Kindness PLLC (57) ABSTRACT

A measurement system for determining a phase and amplitude influence of a device under test, comprising a measurement instrument having a signal generator, a local oscillator, a first mixer and an analysis unit is disclosed. The signal generator is configured to generate a source signal with a predetermined source frequency and a source phase, and to forward the source signal to the device under test, wherein the source signal is altered by the device under test in at least one of amplitude and phase, such that a measurement signal is generated and forwarded to the first mixer. The local oscillator is configured to generate a local oscillator signal with a predetermined local oscillator frequency and a local oscillator phase, and to forward the local oscillator signal to the first mixer. The first mixer is configured to mix the measurement signal and the local oscillator signal, thereby generating a first mixer signal. The analysis unit is located downstream of the first mixer and is configured to analyze the first mixer signal or a processed version of the first mixer signal. The measurement instrument is configured to perform at least two measurements of the phase and amplitude influence of the device under test by analyzing the first mixer signal or the processed version of the first mixer signal, wherein at least one of the source phase and the local oscillator phase is altered between the at least two measurements.

17 Claims, 1 Drawing Sheet

(51) Int. Cl.
*G06F 1/02* (2006.01)
*G01R 31/319* (2006.01)
*H03H 17/06* (2006.01)
*H03L 7/081* (2006.01)

(58) Field of Classification Search
CPC ............ G01R 31/2853; G01R 31/2884; G01R 31/2886; G01R 31/2889; G01R 27/28; G01R 31/31917; G01R 31/31725; G01R 31/31937; G01R 31/31932; G01R 31/3193; G01R 31/31703
USPC ...................................................... 324/76.53
See application file for complete search history.

(56) References Cited

U.S. PATENT DOCUMENTS

| | | | | |
|---|---|---|---|---|
| 10,469,296 | B1 * | 11/2019 | Noujeim | H04L 27/16 |
| 2005/0271164 | A1 * | 12/2005 | Moulthrop | H04L 27/3863 |
| | | | | 375/332 |
| 2011/0288820 | A1 * | 11/2011 | Bednorz | H04B 3/462 |
| | | | | 702/176 |
| 2015/0016616 | A1 * | 1/2015 | Roth | G01R 29/26 |
| | | | | 381/56 |
| 2016/0033563 | A1 * | 2/2016 | Needham | G01R 31/2841 |
| | | | | 324/76.23 |

* cited by examiner

MEASUREMENT SYSTEM AND METHOD FOR DETERMINING A PHASE AND AMPLITUDE INFLUENCE OF A DEVICE UNDER TEST

CROSS-REFERENCES TO RELATED APPLICATION

This application claims the benefit of U.S. Provisional Application No. 62/784,128, filed Dec. 21, 2018, the disclosure of which is incorporated herein in its entirety.

FIELD OF THE DISCLOSURE

Embodiments of the present disclosure relate generally to a measurement system for determining a phase and amplitude influence of a device under test as well as to a method for determining a phase and amplitude influence of a device under test.

BACKGROUND

Measuring the response of a device under test to a test signal applied to the device under test is an important element of debugging and/or testing of devices from a large group of different types of electronic equipment.

In particular, if the response of the device under test to short pulses is to be measured, the temporal resolution of the measurement instrument used for the analysis is of utmost importance.

For such measurements, known measurement instruments use a digital filter that removes parts of an intermediate frequency signal generated during the measurement in order to remove signal components outside of the base band that is to be measured for determining the characteristics of the device under test. This step, however, introduces a correlation between temporally neighboring measurement points such that the temporal resolution is reduced which is disadvantageous since the temporal resolution is of utmost importance for such measurements.

Thus, there is a need for a measurement system as well as for a method for determining a phase and amplitude influence of a device under test that enable measurements of the properties of device under test with a higher temporal resolution.

SUMMARY

Embodiments of the present disclosure provide a measurement system for determining a phase and amplitude influence of a device under test. In an embodiment, the system comprises a measurement instrument having a signal generator, a local oscillator, a first mixer and an analysis unit. The signal generator is configured to generate a source signal with a predetermined source frequency and a source phase, and to forward the source signal to the device under test, wherein the source signal is altered by the device under test in at least one of amplitude and phase, such that a measurement signal is generated and forwarded to the first mixer. The local oscillator is configured to generate a local oscillator signal with a predetermined local oscillator frequency and a local oscillator phase, and to forward the local oscillator signal to the first mixer. The first mixer is configured to mix the measurement signal and the local oscillator signal, thereby generating a first mixer signal. The analysis unit is located downstream of the first mixer and is configured to analyze the first mixer signal or a processed version of the first mixer signal. The measurement instrument is configured to perform at least two measurements of the phase and amplitude influence of the device under test by analyzing the first mixer signal or the processed version of the first mixer signal, wherein at least one of the source phase and the local oscillator phase is altered between the at least two measurements.

The measurement system according to the disclosure is based on the finding that no additional filtering in the digitized part of the signal path is needed in order to measure the phase and amplitude influence of the device under test if the measurement is repeated at least once with the source phase and/or the local oscillator phase being altered between the at least two measurements. Thus, no correlation between neighboring measurement points, i.e. between each two consecutively taken measurement points, is introduced and the measurement can be done with a high temporal resolution.

Accordingly, the signal generator and/or the local oscillator used in the measurement system according to the disclosure is configured to generate the source signal and/or the local oscillator signal, respectively, with an adjustable phase.

The phases, namely the source phase and the local oscillator phase, are defined rather than random, for instance a user or rather an operator of the measurement system may set the phases.

Therein and in the following, the term "processed version of the first mixer signal" is to be understood to mean any kind of signal that arises out of the first mixer signal by any kind of processing, for example filtering, digitizing and/or mixing with other signals.

Of course, the measurement may be repeated more than one time, for example three or four times. It has been found that particularly favourable results are obtained if the measurement is done 2M times, with M being an integer bigger than zero.

For instance, three measurements ensure to eliminate a direct current offset.

Generally, more than two measurements ensure that any interfering power or rather disturbance power can be reduced, for instance the one of noise.

In some embodiments, the source signal and the local oscillator signal are established as analog signals.

According to one aspect of the disclosure, the measurement instrument is configured to alter at least one of the source phase and the local oscillator phase between the at least two measurements in such a way that the difference between the source phase and the local oscillator phase is changed by 90°. In other words, the relative phase between the source phase and the local oscillator phase is varied by 90° between both measurements. It has been found that altering the phase by 90° completely eliminates the influence of signal components that are outside of the base band. Thus, measurements can be done with a high time resolution and without perturbations from spectral components outside of the base band.

Both the source phase and the local oscillator phase may be altered at the same time, such that their difference is changed by 90°. For example, the source phase may be altered by 45° and the local oscillator phase may be altered by −45°. Of course, any other combination of phases may be chosen such that $\varphi_{SO} - \varphi_{LO} = 90°$, wherein $\varphi_{SO}$ is the source phase and $\varphi_{LO}$ is the local oscillator phase.

The measurement instrument may be configured to alter the source phase by 90° between the at least two measurements or to alter the local oscillator phase by 90° between the at least two measurements. In other words, only one of the two phases is adjusted while the other one of the two phases is left unchanged. Usually, the local oscillator frequency is smaller than the source frequency, such that it may be advantageous to alter the local oscillator phase in order to obtain a more precise measurement result.

In some embodiments, the analysis unit is configured to average over the at least two measurements. If the measurement is done more than two times, the average may be taken over several of the iterations of the measurement, for example over all iterations of the measurement. Averaging over the at least two measurements provides several advantages. On one hand, the influence of random noise and/or other random perturbations having an expectation value of zero at least partially cancels when taking the average, such that the influence of the random noise and/or the other random perturbations on the measurement results is decreased. On the other hand, the influence of spectral components outside of the base band is reduced and, if the phase difference between the at least two iterations is chosen to be 90°, completely cancels out. Thus, the measurement system is capable of measuring the phase and amplitude influence of the device under test with a high temporal resolution and with reduced influences of random noise, other perturbations and signal components outside of the base band.

The measurement system may further comprise a numerically controlled oscillator and a second mixer, the numerically controlled oscillator being configured to generate a numerical oscillator signal with a predetermined numerical oscillator frequency and a numerical oscillator phase, and the numerically controlled oscillator being configured to forward the numerical oscillator signal to the second mixer, the second mixer being located downstream of the first mixer and upstream of the analysis unit, and the second mixer being configured to mix the numerical oscillator signal with the first mixer signal or with a processed version of the first mixer signal. Via the numerically controlled oscillator, the source phase and the local oscillator phase can be compensated such that they do not influence the final result.

In some embodiments, the numerical oscillator signal is a digital, complex-valued signal that is defined at times being an integer multiple of the inverse sampling rate. In other words, the numerical oscillator is provided in a digital part of the signal path of the measurement instrument, i.e. downstream of an analog-to-digital converter having the sampling rate.

According to another aspect of the disclosure, the numeric oscillator is configured to generate the numeric oscillator signal with a numeric oscillator phase being equal to the difference of the local oscillator phase and the source phase. Thus, the numeric oscillator phase $\varphi_{NCO}$ is given by $\varphi_{NCO} = \varphi_{LO} - \varphi_{SO}$. This way, the dependence on the source phase and on the local oscillator phase cancels out when taking an average over the at least two measurements.

In a certain embodiment of the disclosure, a low-pass filter is provided downstream of the first mixer immediately after the first mixer. The low-pass filter is configured to remove signal components having a frequency being higher than a predefined upper frequency limit.

In some embodiments, an analog-to-digital converter is provided downstream of the low-pass filter immediately after the low-pass filter. The analog-to-digital converter is configured to digitize the first mixer signal that was filtered by the low-pass filter with a predetermined sample rate. In some embodiments, the low-pass filter removes all signal components having a frequency being higher than half the sample rate. In other words, the low-pass filter is established as an anti-aliasing filter.

The measurement instrument may be configured to perform three or four measurements of the phase and amplitude influence of the device under test, wherein the measurement instrument is configured to alter at least one of the source phase and the local oscillator phase between the measurements in such a way that the difference between the source phase and the local oscillator phase is changed by 90° every time. Three measurements are already sufficient to completely eliminate the influence of a direct current (DC) offset due to the analog-to-digital converter from the measurement results as the DC offset sufficiently cancels out when averaging over the three iterations of the measurement. Four measurements further improve the elimination.

According to a certain aspect of the disclosure, the measurement system comprises the device under test.

In another embodiment of the disclosure, the measurement instrument is established as a vector network analyzer. Thus, the measurement instrument may be configured to measure the S-parameters of the device under test, for example with pulses being applied to the device under test. In other words, the source signal generated by the signal generator may be established as a pulse with a predetermined duration, for example as a short pulse.

Embodiments of the present disclosure further provide a method for determining a phase and amplitude influence of a device under test. In an embodiment, the method comprises the following steps:

generating a source signal with a predetermined source frequency and a source phase, and forwarding the source signal to the device under test, wherein the source signal is altered by the device under test in at least one of amplitude and phase such that a measurement signal is generated;

generating a local oscillator signal with a predetermined local oscillator frequency and a local oscillator phase;

mixing the measurement signal and the local oscillator signal, thereby generating a first mixer signal; and analyzing the first mixer signal or a processed version of the first mixer signal in order to determine the phase and amplitude influence of the device under test, wherein the measurement defined by the steps above is performed at least twice, wherein at least one of the source phase and the local oscillator phase is altered between the two measurements.

The method according to the disclosure is based on the finding that no additional filtering in the digitized part of the signal path is needed in order to measure the phase and amplitude influence of the device under test if the measurement is repeated at least once with the source phase and/or the local oscillator phase being altered between the at least two measurements. Thus, no correlation between neighboring measurement points, i.e. between each two consecutively taken measurement points, is introduced and the measurement can be done with a high temporal resolution.

In some embodiments, the measurement system described above is used for performing the method according to the disclosure.

As mentioned above, the phases, namely the source phase and the local oscillator phase, are defined rather than random, for instance a user or rather an operator of the measurement system may set the phases.

Therein and in the following, the term "processed version of the first mixer signal" is to be understood to mean any kind of signal that arises out of the first mixer signal by any kind of processing, for example filtering, digitizing and/or mixing with other signals.

Of course, the measurement may be repeated more than one time, for example three or four times. It has been found that particularly favourable results are obtained if the measurement is done 2M times, with M being an integer bigger than zero.

At least one of the source phase and the local oscillator phase may be altered between the at least two measurements in such a way that the difference between the source phase and the local oscillator phase is changed by 90°. Hence, the relative phase between the source phase and the local oscillator phase is altered by 90°. It has been found that altering the phase by 90° completely eliminates the influence of signal components that are outside of the base band. Thus, measurements can be done with a high time resolution and without perturbations from spectral components outside of the base band.

Both the source phase and the local oscillator phase may be altered at the same time, such that their difference is changed by 90°. For example, the source phase may be altered by 45° and the local oscillator phase may be altered by −45°. Of course, any other combination of phases may be chosen such that $\varphi_{SO}-\varphi_{LO}=90°$, wherein $\varphi_{SO}$ is the source phase and $\varphi_{LO}$ is the local oscillator phase.

According to a further aspect of the disclosure, the source phase is altered by 90° between the at least two measurements or the local oscillator phase is altered by 90° between the at least two measurements. In other words, only one of the two phases is adjusted while the other one of the two phases is left unchanged. Usually, the local oscillator frequency is smaller than the source frequency, such that it may be advantageous to alter the local oscillator phase in order to obtain a more precise measurement result.

In a certain embodiment of the disclosure, an average is taken over the at least two measurements. If the measurement is done more than two times, the average may be taken over several of the iterations of the measurement, for example over all iterations of the measurement. Averaging over the at least two measurements provides several advantages. On one hand, the influence of random noise and/or other random perturbations having an expectation value of zero at least partially cancels when taking the average, such that the influence of the random noise and/or the other random perturbations on the measurement results is decreased. On the other hand, the influence of spectral components outside of the base band is reduced and, if the phase difference between the at least two iterations is chosen to be 90°, completely cancels out. Thus, the method according to the disclosure is capable of measuring the phase and amplitude influence of the device under test with a high temporal resolution and with reduced influences of random noise, other perturbations and signal components outside of the base band.

In some embodiments, a numerical oscillator signal with a predetermined numerical oscillator frequency and a numerical oscillator phase is generated and mixed with the first mixer signal or the processed version of the first mixer signal. Via the numerically controlled oscillator, the source phase and the local oscillator phase can be compensated such that they do not influence the final result.

In another embodiment of the disclosure, the numeric oscillator signal is generated with a numeric oscillator phase being equal to the difference of the local oscillator phase and the source phase.

Thus, the numeric oscillator phase $\varphi_{NCO}$ is given by $\varphi_{NCO}=\varphi_{LO}-\varphi_{SO}$. This way, the dependence on the source phase and on the local oscillator phase cancels out when taking an average over the at least two measurements.

According to a further aspect of the disclosure, the measurement of the phase and amplitude influence of the device under test is performed three or four times, wherein at least one of the source phase and the local oscillator phase is altered between the individual measurements in such a way that the difference between the source phase and the local oscillator phase is changed by 90° every time. This way, the influence of a direct current (DC) offset due to the analog-to-digital converter can be completely eliminated from the measurement results as the DC offset completely cancels out when averaging over the several iterations of the measurement.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
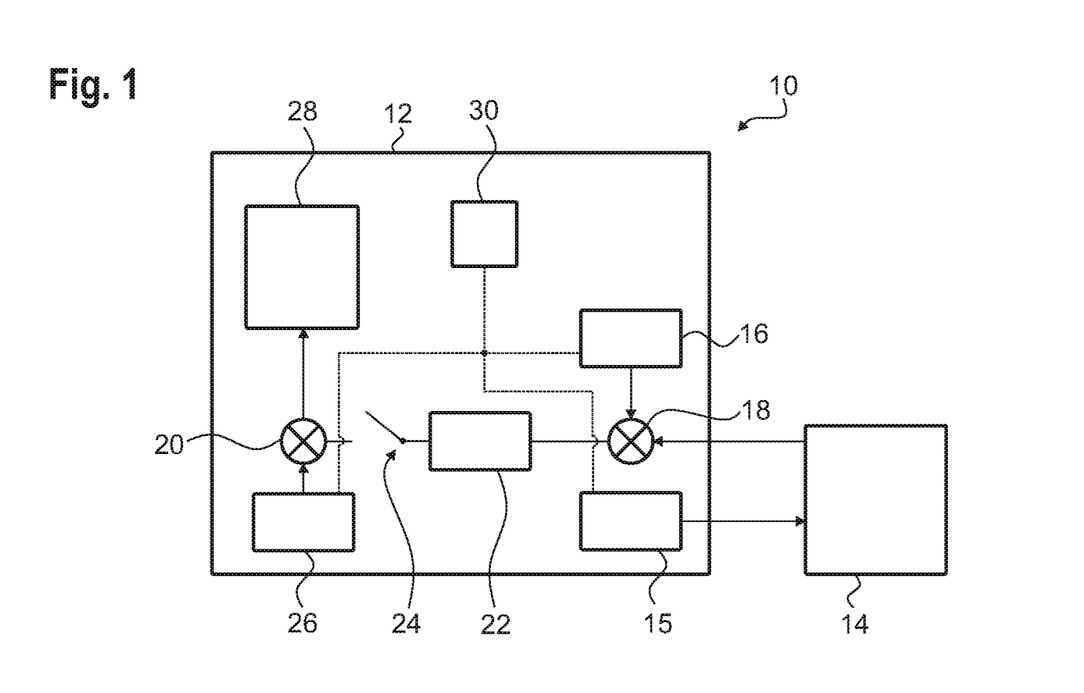
FIG. 1 schematically shows a representative measurement system according to the disclosure.

FIG. 1 schematically shows a measurement system 10 comprising a measurement instrument 12 and a device under test 14. The measurement instrument 12 is established as a vector network analyzer and comprises a signal generator 15, a local oscillator 16, a first mixer 18, a second mixer 20, a low-pass filter 22, an analog-to-digital converter 24, a numerically controlled oscillator 26 and an analysis unit 28. In some embodiments, the measurement instrument 12 is configured to measure the S-parameters of the device under test 14.

The device under test 14 is connected to both the signal source 15 and to the first mixer 18, wherein the device under test 14 is located downstream of the signal source 15 and upstream of the first mixer 18. The local oscillator 16 is connected to the first mixer 18, such that the first mixer 18 is connected to both the signal generator 15 and to the local oscillator 16. Immediately adjacent to the first mixer 18, the low-pass filter 22 is connected to the first mixer 18 downstream of the first mixer 18 wherein the analog-to-digital converter 24 is connected to the low-pass filter 22 immediately downstream of the low-pass filter 22. The analog-to-digital converter 24, the numerically controlled oscillator 26 and the analysis unit 28 are connected to the second mixer 20, wherein the analog-to-digital converter 24 and the numerically controlled oscillator 26 are located upstream of the second mixer 20, and wherein the analysis unit 28 is provided downstream of the second mixer 20.

The measurement instrument 12 in some embodiments comprises control circuitry, such as a control unit 30, that is connected to at least one of the signal generator 15, the local oscillator 16 and the numerically controlled oscillator 26 in a signal transmitting manner. The control unit 30 is configured to cause the measurement instrument 12 to perform the steps of a method for determining a phase and amplitude influence of the device under test 14, which steps are described in the following with reference to FIG. 2.

Figure 2:
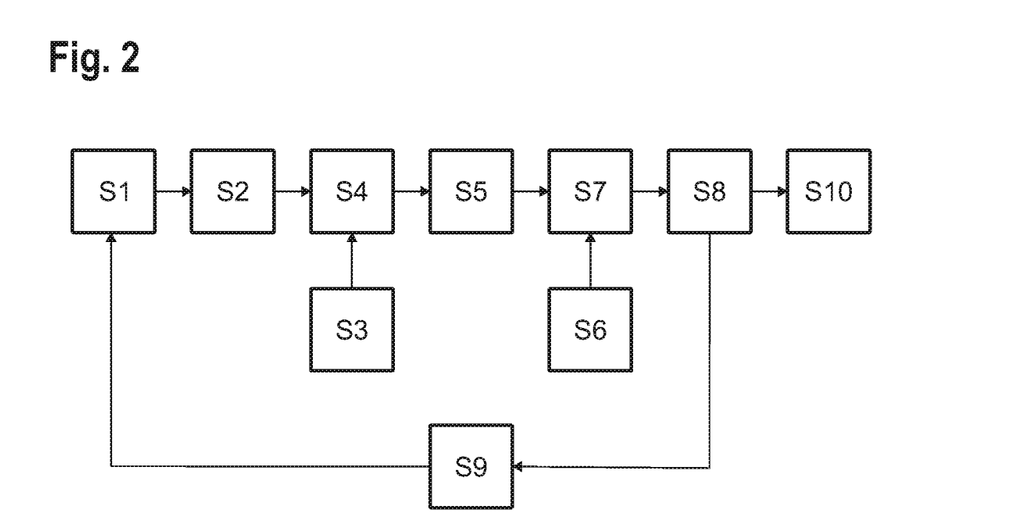
FIG. 2 shows a flow chart of a representative method according to the disclosure

First, a source signal $s_{SO}(t)$ with a predetermined source frequency $f_{SO}$ and a source phase $\varphi_{SO}$ is generated via the signal generator 15 and forwarded to the device under test 14 (step S1). Without loss of generality, the source signal is normalized to an amplitude of one and has the following form:

$$s_{SO}(t)=\cos(2\pi f_{SO}t+\varphi_{SO}).$$

Generally, the source signal may be a short pulse. In this case, the expression above has to be multiplied with additional suitable factors and/or with suitable Heaviside-Theta-functions.

The source signal is altered by the device under test 14 in amplitude and in phase since the device under test 14 has electronic components varying the amplitude and/or phase while processing the source signal, such that a measurement signal $s_{meas}$ is generated and forwarded to the first mixer 18 (step S2). Accordingly, the measurement signal corresponds to the source signal processed by the device under test 14. The measurement signal has the following general form:

$$s_{meas}(t)=A\cos(2\pi f_{SO}t+\varphi_{SO}+\varphi),$$

wherein A describes the influence of the device under test 14 on the amplitude of the source signal and φ describes the influence of the device under test 14 on the phase of the source signal. In other words, the measurement signal is related to the source signal by means of an amplitude change and a change in phase caused by the device under test 14, for example the at least one electronic component.

Moreover, a local oscillator signal $s_{LO}(t)$ is generated with a predetermined local oscillator frequency $f_{LO}$ and a phase $\varphi_{LO}$ via the local oscillator 16 and forwarded to the first mixer 18 (step S3). Without loss of generality, the local oscillator signal is normalized to an amplitude of one and has the following form:

$$s_{LO}(t)=\cos(2\pi f_{LO}t+\varphi_{LO}).$$

The local oscillator signal and the measurement signal are now mixed by the first mixer 18, thereby generating an intermediate frequency signal $s_{IF}(t)$ (step S4) that is given by $$s_{IF}(t)=A\cos(2\pi f_{SO}t+\varphi_{SO}+\varphi)\cos(2\pi f_{LO}t+\varphi_{LO})$$

The intermediate frequency signal is outputted by the first mixer 18 wherein the intermediate frequency signal is filtered by the low-pass filter 22 and digitized by the analog-to-digital converter 24 (step S5) which are located downstream of the first mixer 18.

The low-pass filter 22 removes signal components whose frequency is bigger than half the sampling rate $f_S$ of the analog-to-digital converter 24 before the intermediate frequency signal is digitized by the subsequent analog-to-digital converter 24. In other words, the low-pass filter 22 is an anti-aliasing filter.

The filtered and digitized intermediate frequency signal is then forwarded to the second mixer 20.

Moreover, a numerical oscillator signal $s_{NCO}(t)$ is generated via the numerically controlled oscillator 26 with a predetermined numerical oscillator frequency $f_{NCO}$ and a phase $\varphi_{NCO}$, and the numerical oscillator signal is forwarded to the second mixer 20 (step S6).

Therein, the numerical oscillator signal is a digital, complex-valued signal that is defined at times t being an integer multiple of the inverse sampling rate $f_S$ of the analog-to-digital converter 24. In other words, the numerical oscillator signal can be written as $$s_{NCO}(t) = e^{i(2\pi f_{NCO}t+\varphi_{NCO})};\ t = \frac{n}{f_S}.$$

Now, the numerical oscillator signal and the filtered and digitized intermediate frequency signal are mixed by the second mixer 20, such that a processed measurement signal $s_{proc}(t)$ is generated and forwarded to the analysis unit 28 (step S7). In general, the processed measurement signal has the following form:

$$s_{proc}(t)=A\cos(2\pi f_{SO}t+\varphi_{SO}+\varphi)\cos(2\pi f_{LO}t+\varphi_{LO})e^{i(2\pi f_{NCO}t+\varphi_{NCO})}.$$

However, only the frequency $f_{IF}=f_{SO}-f_{LO}$ as a result of the mixing by the first mixer 18 is kept due to the low-pass filter 22 that was passed by the intermediate frequency signal previously. Moreover, the numeric oscillator frequency is chosen to be $f_{NCO}=-f_{IF}$. Thus, the processed measurement signal takes the following form:

$$s_{proc}(t)=A\cos(2\pi f_{IF}t+\varphi_{SO}+\varphi_{LO}+\varphi)e^{-i(2\pi f_{IF}t-\varphi_{NCO})}.$$

The processed measurement signal is then analyzed by the analysis unit 28 in order to determine the phase and amplitude influence of the device under test 14 (step S8). In other words, the analysis unit 28 determines the unknown parameters A and φ which relate to the device under test 14, for example its influence on the signal processed by the device under test 14, namely the source signal processed.

However, one measurement is not enough for the analysis unit 28 to be able to determine both parameters A and φ. Thus, the steps S1 to S8 described above are performed at least two times with a particular choice of the phases $\varphi_{SO}$, $\varphi_{LO}$ and $\varphi_{NCO}$ during each iteration of the measurement.

More precisely, the choices $\varphi_{SO,(0)}-\varphi_{LO,(0)}=\delta$ and $\varphi_{NCO,(0)}=-\delta$ are employed for the first iteration of the measurement, which iteration is indicated by the subscript "(0)", wherein δ is an adjustable parameter.

For the second iteration of the measurement, the phases are adjusted to differ from the phases employed in the first iteration of the measurement (step S9).

More precisely, the choices $$\varphi_{SO,(1)} - \varphi_{LO,(1)} = \delta + \frac{\pi}{2}\ \text{and}\ \varphi_{NCO,(0)} = -\delta - \frac{\pi}{2}$$

are employed for the second iteration of the measurement, which iteration is indicated by the subscript "(1)", wherein δ is the same adjustable parameter as above.

In other words, a phase difference of 90° is introduced between the first iteration of the measurement and the second iteration of the measurement. This can be achieved by altering the source phase $\varphi_{SO}$, by altering the local oscillator phase $\varphi_{LO}$ or by altering both the source phase $\varphi_{SO}$ and the local oscillator phase $\varphi_{LO}$. In any case, the relative phase is varied by 90°.

Accordingly, the phases $\varphi_{SO}$, $\varphi_{LO}$ and $\varphi_{NCO}$ are set or defined rather than randomly chosen.

After the two iterations of the measurement have been performed, the analysis unit 28 averages over both iterations (step S10) in order to determine the phase and amplitude influence of the device under test 14 on the signal processed, namely the source signal processed.

The average $b_n$ of the processed measurement signal at sample point number n is given by:

$$b_n = \frac{1}{2}(s_{proc,(n,0)} + s_{proc,(n,1)}) = \frac{A_n}{4}e^{i\varphi_n}.$$

Thus, the method described above enables a measurement of both the amplitude and the phase change induced by the device under test 14 at every sample point n. Moreover, the method described above reduces the impact of random noise on the result of the measurement, as the contribution of random noise partly cancels out between the two measurements.

In order to further reduce the impact of random noise, more than two iterations of measurements can be performed. Advantageously, 2M measurements are performed, wherein M is an integer number bigger than 1.

Therein, one may freely choose the phases for the first M measurement iterations to be $\varphi_{SO,(m)} - \varphi_{LO,(m)} = \delta_m$ and $\varphi_{NCO,(m)} = -\delta_m$ for $0 \leq m < M$. Accordingly, the phases for the second M measurements are chosen to be $$\varphi_{SO,(m)} - \varphi_{LO,(m)} = \delta_m + \frac{\pi}{2} \text{ and } \varphi_{NCO,(m)} = -\delta_m - \frac{\pi}{2}$$

for $M \leq m < 2M$.

An average is taken over all 2M measurements, such that the influence of random noise is further reduced, as this influence at least partly cancels out when taking the average.

Moreover, the method described above may easily be adapted to enable to determine and/or remove an influence of a direct current (DC) offset due to the analog-to-digital converter 24. The DC offset results in a modified processed measurement signal $s'_{proc}(t)$ which is given by $$s'_{proc}(t) = [A\cos(2\pi f_{IF}t + \varphi_{SO} - \varphi_{LO} + \varphi) + \xi]e^{-i(2\pi f_{IF}t - \varphi_{NCO})},$$

wherein the additional parameter $\xi$ represents the DC offset.

More precisely, this additional parameter $\xi$ may be determined by the analysis unit 28 after at least three iterations of the measurement process.

A specific strategy to eliminate the influence of the DC offset is to perform four iterations of the measurement process, with the following choices of phases for each iteration:

$$\varphi_{SO,(m)} - \varphi_{LO,(m)} = \delta + m \cdot \frac{\pi}{2} \text{ and } \varphi_{NCO,(m)} = -\delta_m - m \cdot \frac{\pi}{2} \text{ for } 0 \leq m \leq 3.$$

Averaging over all four iterations, the influence of the DC offset completely cancels, such that the analysis unit may determine A and $\varphi$ without the influence of the DC offset. In other words, the average $b_n$ at sample point n is given by $$b_n = \frac{1}{2}(s_{proc,(n,0)} + s_{proc,(n,1)} + s_{proc,(n,2)} + s_{proc,(n,3)}) = \frac{A_n}{4}e^{i\varphi_n},$$

from which it can clearly be seen that the dependence on the DC offset has cancelled in the average over the four terms.

As described above, one or more aspects of the methods set forth herein are carried out in a computer system. In this regard, a program element is provided, which is configured and arranged when executed on a computer to determine a phase and amplitude influence of a device under test. In one embodiment, the program element may specifically be configured to perform the steps of: generating a source signal with a predetermined source frequency and a source phase, and forwarding the source signal to the device under test, wherein the source signal is altered by the device under test in at least one of amplitude and phase such that a measurement signal is generated, generating a local oscillator signal with a predetermined local oscillator frequency and a local oscillator phase, mixing the measurement signal and the local oscillator signal, thereby generating a first mixer signal, and analyzing the first mixer signal or a processed version of the first mixer signal in order to determine the phase and amplitude influence of the device under test. In some embodiments, the measurement defined by the steps above is performed at least twice, wherein at least one of the source phase and the local oscillator phase is altered between the two measurements. In other embodiments, the program element may specifically be configured to perform the steps of the method claims set forth herein.

The program element may be installed in a computer readable storage medium. The computer readable storage medium may be any one of the computing devices, control units, etc., described elsewhere herein or another and separate computing device, control unit, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present disclosure may also be implemented as methods, apparatus, systems, computing devices, computing entities, and/or the like, as have been described elsewhere herein. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and/or flowchart illustrations of apparatuses, methods, systems, and computer program products. It should be understood that each block of any of the block diagrams and/or flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or carry out the methods described herein.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks and/or carry out the methods described herein.

It will be appreciated that the term computer can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and/or flowchart illustrations, could be implemented by special purpose hardware-based computer systems or circuits, etc., that perform the specified functions or operations, or combinations of special purpose hardware and computer instructions.

According to various embodiments, many individual steps of a process may or may not be carried out utilizing the computer systems and/or servers described herein, and the degree of computer implementation may vary, as may be desirable and/or beneficial for one or more particular applications.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed The embodiments of the invention in which an exclusive property or privilege is claimed are defined as follows:

1. A measurement system for determining a phase and amplitude influence of a device under test, comprising a measurement instrument having a signal generator, a local oscillator, a first mixer and an analysis unit, the signal generator being configured to generate a source signal with a predetermined source frequency and a source phase, and to forward said source signal to the device under test, wherein the source signal is altered by the device under test in at least one of amplitude and phase, such that a measurement signal is generated and forwarded to the first mixer, the local oscillator being configured to generate a local oscillator signal with a predetermined local oscillator frequency and a local oscillator phase, and to forward said local oscillator signal to the first mixer, the first mixer being configured to mix said measurement signal and said local oscillator signal, thereby generating a first mixer signal, the analysis unit being located downstream of the first mixer and being configured to analyze the first mixer signal or a processed version of said first mixer signal, and the measurement instrument being configured to perform at least two measurements of the phase and amplitude influence of the device under test by analyzing said first mixer signal or said processed version of said first mixer signal, wherein at least one of the source phase and the local oscillator phase is altered between the at least two measurements, wherein the measurement instrument is configured to alter at least one of the source phase or the local oscillator phase between the at least two measurements in such a way that the difference between the source phase and the local oscillator phase is changed by 90°.

2. The measurement system of claim 1, wherein the measurement instrument is configured to alter the source phase by 90° between the at least two measurements or to alter the local oscillator phase by 90° between the at least two measurements.

3. The measurement system of claim 1, wherein the analysis unit is configured to average over the at least two measurements.

4. The measurement system of claim 1, further comprising a numerically controlled oscillator and a second mixer, the numerically controlled oscillator being configured to generate a numerical oscillator signal with a predetermined numerical oscillator frequency and a numerical oscillator phase, and the numerically controlled oscillator being configured to forward said numerical oscillator signal to the second mixer, the second mixer being located downstream of the first mixer and upstream of the analysis unit, and the second mixer being configured to mix said numerical oscillator signal with said first mixer signal or with a processed version of said first mixer signal.

5. The measurement system of claim 4, wherein the numeric oscillator is configured to generate the numeric oscillator signal with a numeric oscillator phase being equal to the difference of the local oscillator phase and the source phase.

6. The measurement system of claim 1, wherein a low-pass filter is provided downstream of the first mixer immediately after the first mixer.

7. The measurement system of claim 6, wherein an analog-to-digital converter is provided downstream of the low-pass filter immediately after the low-pass filter.

8. The measurement system of claim 1, wherein the measurement instrument is configured to perform three or four measurements of the phase and amplitude influence of the device under test, wherein the measurement instrument is configured to alter at least one of the source phase and the local oscillator phase between the measurements in such a way that the difference between the source phase and the local oscillator phase is changed by 90° every time.

9. The measurement system of claim 1, comprising said device under test.

10. The measurement system of claim 1, wherein the measurement instrument is established as a vector network analyzer.

11. A method for determining a phase and amplitude influence of a device under test, comprising the following steps:

generating a source signal with a predetermined source frequency and a source phase, and forwarding said source signal to the device under test, wherein the source signal is altered by the device under test in at least one of amplitude and phase such that a measurement signal is generated, generating a local oscillator signal with a predetermined local oscillator frequency and a local oscillator phase, mixing said measurement signal and said local oscillator signal, thereby generating a first mixer signal, and analyzing the first mixer signal or a processed version of said first mixer signal in order to determine the phase and amplitude influence of the device under test, wherein the measurement defined by the steps above is performed at least twice, wherein at least one of the source phase and the local oscillator phase is altered between the two measurements, wherein at least one of the source phase or the local oscillator phase is altered between the at least two measurements in such a way that the difference between the source phase and the local oscillator phase is changed by 90°.

12. The method of claim 11, the source phase is altered by 90° between the at least two measurements or the local oscillator phase is altered by 90° between the at least two measurements.

13. The method of claim 11, wherein an average is taken over the at least two measurements.

14. The method of claim 11, wherein a numerical oscillator signal with a predetermined numerical oscillator frequency and a numerical oscillator phase is generated and mixed with said first mixer signal or said processed version of said first mixer signal.

15. The method of claim 14, wherein the numeric oscillator signal is generated with a numeric oscillator phase being equal to the difference of the local oscillator phase and the source phase.

16. The method of claim 11, wherein the measurement of the phase and amplitude influence of the device under test is performed three or four times, wherein at least one of the source phase and the local oscillator phase is altered between the individual measurements in such a way that the difference between the source phase and the local oscillator phase is changed by 90° every time.

17. A measurement system for determining a phase and amplitude influence of a device under test, comprising a measurement instrument having a signal generator, a local oscillator, a first mixer and an analysis unit, the signal generator being configured to generate a source signal with a predetermined source frequency and a source phase, and to forward said source signal to the device under test, wherein the source signal is altered by the device under test in at least one of amplitude and phase, such that a measurement signal is generated and forwarded to the first mixer, the local oscillator being configured to generate a local oscillator signal with a predetermined local oscillator frequency and a local oscillator phase, and to forward said local oscillator signal to the first mixer, the first mixer being configured to mix said measurement signal and said local oscillator signal, thereby generating a first mixer signal, the analysis unit being located downstream of the first mixer and being configured to analyze the first mixer signal or a processed version of said first mixer signal, and the measurement instrument being configured to perform at least two measurements of the phase and amplitude influence of the device under test by analyzing said first mixer signal or said processed version of said first mixer signal, wherein at least one of the source phase and the local oscillator phase is altered between the at least two measurements,
wherein the measurement instrument is configured to alter the source phase by 90° between the at least two measurements or to alter the local oscillator phase by 90° between the at least two measurements.

* * * * *